United States Patent [19]

Sumi

[11] 4,258,265

[45] Mar. 24, 1981

[54] ELECTRON BEAM EXPOSING APPARATUS

[75] Inventor: Masahiko Sumi, Yokohama, Japan

[73] Assignee: Tokyo Shibaura Electric Company, Limited, Kawasaki, Japan

[21] Appl. No.: 5,499

[22] Filed: Jan. 22, 1979

Related U.S. Application Data

[63] Continuation of Ser. No. 799,997, May 24, 1977.

[30] Foreign Application Priority Data

May 26, 1976 [JP] Japan .................................. 51-60175

[51] Int. Cl.³ .............................................. A61K 27/02
[52] U.S. Cl. .............................. 250/492 A; 250/396 R; 250/492 R
[58] Field of Search ............ 250/492 A, 492 R, 396 R

[56] References Cited

U.S. PATENT DOCUMENTS

| | | | |
|---|---|---|---|
| 3,876,883 | 4/1975 | Broers | 250/491 |
| 4,145,597 | 3/1979 | Yasuda | 250/396 R |

OTHER PUBLICATIONS

"New Imaging & Deflection"-by Pfeiffer, Journal of Vacuum Science Technology, vol. 12. No. 6, Nov./Dec. 1975, pp. 1170-1173.
"Automatic Stabilization of an Electron Probe"-by Doran et al. Journal Vacuum Science Technology, vol. 12, No. 6, Nov./Dec. 75, pp. 1174-1176.

Primary Examiner—Harold A. Dixon
Attorney, Agent, or Firm—Oblon, Fisher, Spivak, McClelland & Maier

[57] ABSTRACT

Electron beam exposing apparatus includes first and second apertures to pass an electron beam and, a deflection device to change the incident position of the electron beam onto the second aperture to control a projected pattern configuration.

3 Claims, 7 Drawing Figures

(a)　　　　(b)　　　　(c)

ELECTRON BEAM EXPOSING APPARATUS

This is a continuation of application Ser. No. 799,997 filed May 24, 1977.

BACKGROUND OF THE INVENTION

This invention relates to an electron beam exposing device and in particular an electron beam exposing apparatus adopting a novel projection method.

An electron beam exposure system is generally classified into a pencil beam write system (see U.S. Pat. No. 3,900,737) and a projection system. Among these the latter system is excellent in a "describe" speed, but it requires a mask corresponding to an original pattern i.e. a pattern imaged onto an object to be exposed. However, it is difficult to prepare such a mask or replace one mask with the other. Furthermore, it is impossible to use a pattern whose periphery is surrounded.

SUMMARY OF THE INVENTION

It is accordingly the object of this invention to provide an electron beam exposing apparatus which is capable of controlling a pattern configuration utilizing a projection exposure method by which a wide area can be exposed at a time.

BRIEF DESCRIPTION OF THE DRAWING

This invention will be further described by way of example by referring to the accompanying drawings in which.

The fundamental concept of this invention will now be explained below by referring to FIG. 1.

Figure 1:
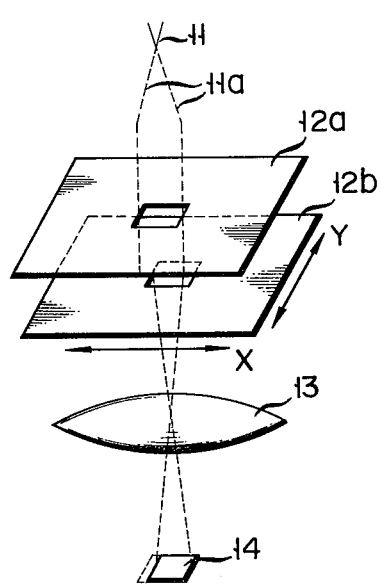
FIG. 1 is a schematic diagram for explaining the fundamental concept of this invention.
Figure 2:
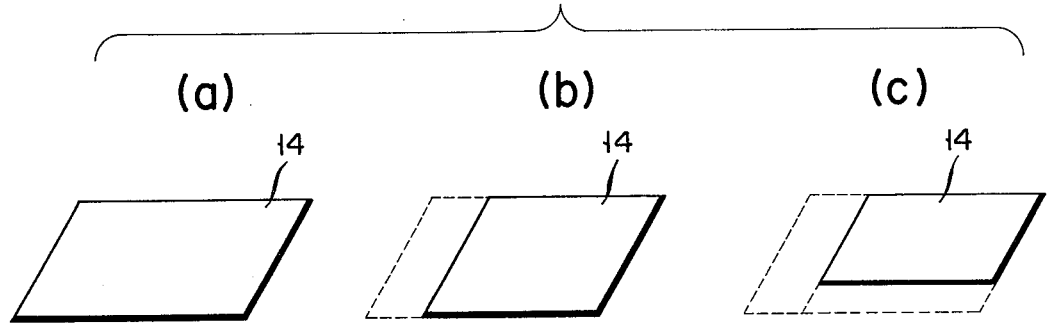
FIGS. 2 (a, b, c) show patterns as described by an apparatus used in FIG. 1.

In FIG. 1 an electron beam 11a is extracted from an electron beam source i.e. an electron gun 11. The beam 11a is passed through first and second apertures 12a and 12b to an electron lens 13 by which a predetermined pattern 14 is projected. It is important to note that the second aperture 12b be provided which can be electrically or mechanically moved relative to the incident beam 12a in the X- and Y-directions. The relative movement of the second aperture 12b can properly change the pattern, for example, as shown in FIGS. 2 (a, b, c).

One embodiment of this invention will be explained below by referring to FIG. 3.

Figure 3:
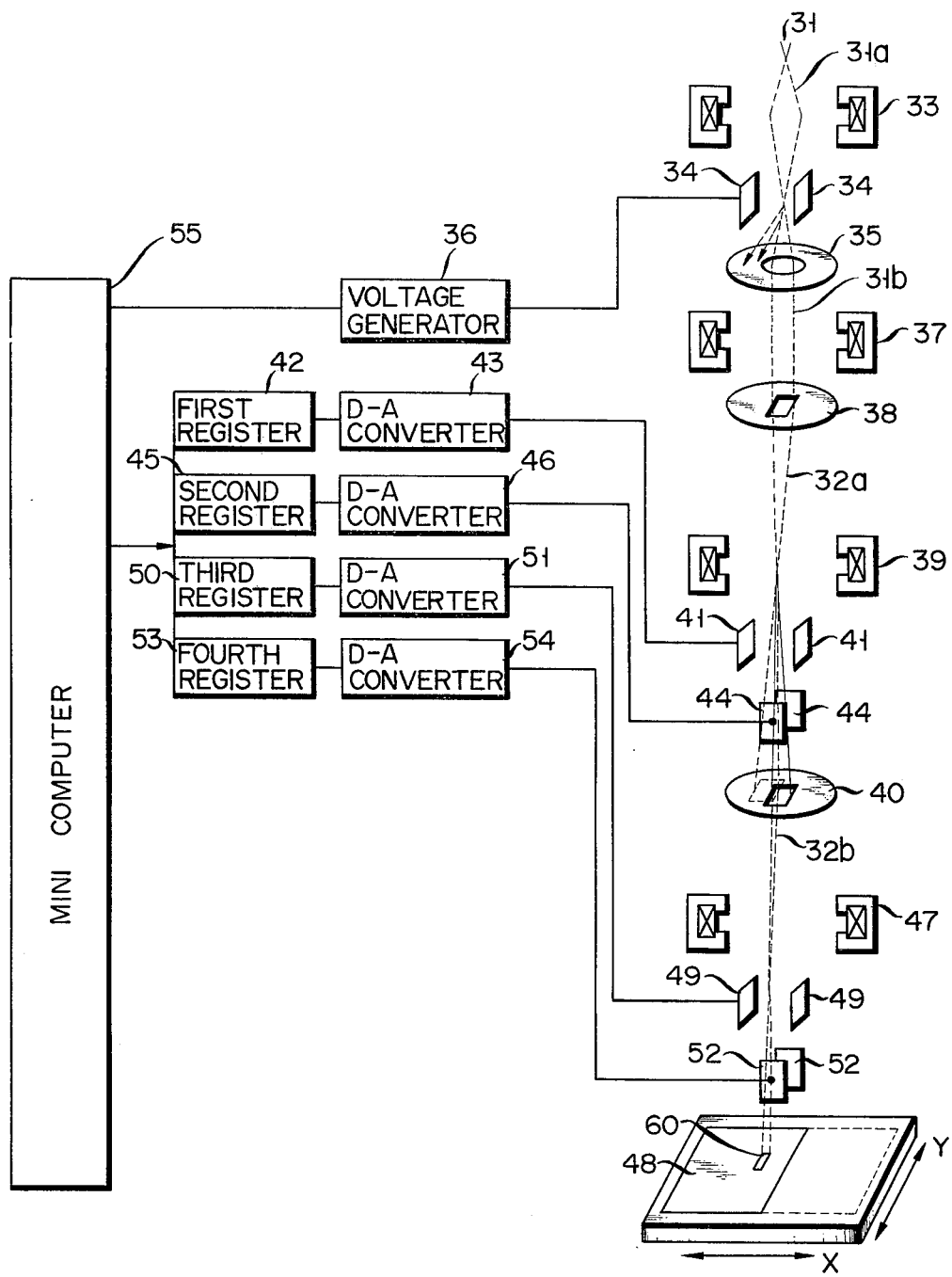
FIG. 3 is a schematic diagram showing an electron beam exposing apparatus according to one embodiment of this invention.

In FIG. 3 an electron beam 31a is extracted or emitted from an electron gun 31. The beam 31a is focussed at a substantially middle point of blanking electrodes 34, 34 through a first electron lens 33. A slit 35 for blanking permits the beam 31a to be passed when a voltage on the blanking voltage generating circuit 36 of the blanking electrodes 34 is at a "0" [V] level and be cut off when the voltage on the blanking voltage generating circuit 36 is at a 40V level. The beam 31b passed through the slit 35 is transformed, by a second electron lens 37 comprised of a condenser lens, into a parallel pattern of beam which in turn is directed toward a first restricting means 38 having a rectangular (for example, a square or oblong) aperture. The first restricting means 38 corresponds in principle to the aperture 12a shown in FIG. 1.

The beam source will be explained hereinafter as the first restricting means 38. It should be noted, however, that the manner of expressing the flux of beam passed through the first restricting means 38 is reversed unlike the normal manner of expressing the flux of beam, for example, the flux of beam diverges at a point upon which it is focussed. This manner of expression is made for brevity's sake. A rectangular pattern of image whose light source is the first restricting means 38 is focussed by a third electron lens 39 onto a second restricting means 40 having a rectangular shape such as a square or an oblong shape.

When voltages applied to X-direction deflection electrodes 41 and Y-direction deflection electrodes 44 are at the 0(V) level, the beam 32a is all transmitted to form a square pattern on the second restricting means 40. One side of a square aperture provided in the second restricting means is 2.56 mm. The X-direction deflection electrodes 41 are so designed that the beam 32a is deflected at a rate of 0.01 mm per 0.1 V. When a 256 V voltage is applied between the X-direction deflection electrodes 41 the beam 32a is all deflected away from the aperture of the restricting means 40 and cut off. Where, for example, a 5 $\mu$m $\times$ 100 $\mu$m rectangular pattern of beams is desired to be finally obtained, "5" is written as an X-direction width data in a first register 42 and "100" is written as a Y-direction width data in a second register 45 using a mini-computer 55. Then, 25.1 V and 15.6 V voltages appear from D-A converters 43 and 46, respectively. For this reason, only a beam pattern having a 50 $\mu$m width in the X-direction and a 1 mm width in the Y-direction is finally passed through the aperture of the second restricting means. The beam 32b passed through the second means 40 is, after reduced by a fourth electron lens 47 to a 10:1 scale, focussed onto an object where a desired 5 $\mu$m $\times$ 100 $\mu$m rectangular pattern of beams 60 is formed. The beam 32b is here deflected by another X-direction deflection electrodes 49 in the X-direction with its rectangular pattern held. Corresponding desired amount of deflection is taken out from a D-A converter 51 based on the contents of a third register 50 which are given by the mini-computer 55. It should be noted here that, since the central position of the rectangular pattern formed on the second restricting means 40 varies dependent upon the dimensions of the rectangular pattern, a value entering in the third register 50 should be properly corrected. Where a non-corrected value is used, a circuit correction may be made by properly adding the output voltage of the first converter 43 to the output voltage of the third D-A converter 51. On the other hand, the beam 32b is deflected by another Y-direction deflection electrodes 52 in the Y-direction with its rectangular pattern held. A corresponding desired amount of deflection is taken out from a fourth D-A converter 54 based on the contents of a fourth register 53 which are given by the mini-computer. In this embodiment, after an internal pattern of a 256-step angle has been described the object 48 is moved to the next step by the mini-computer so as to describe a next frame. The associated circuit and means such as a motor may be of a known type and they are, therefore, omitted. Since the first and second restricting means evolve a great heat at the beam incident time, a measure may be taken against a thermal deformation by water-cooling them or placing in front of each restricting means another restricting means having a somewhat larger aperture than that of said each restricting means.

In this way, an original pattern mask is electrically formed through utilization of the features of the projection method to permit a predetermined electronic beam exposure.

Figure 4:
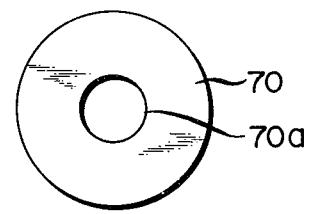
FIGS. 4 and 5 show modifications of beam pattern resulating means in FIG. 3.
Figure 5:
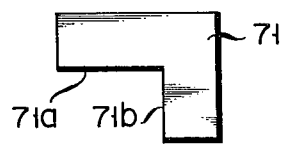

In the above-mentioned embodiment the first and second restricting means, each, have only one aperture, but they may have a plurality of apertures. The regulating means may be a beam pattern regulating means 70 having a circular aperture 70a as shown in FIG. 4 and the regulating means may also be an L-shaped plate 71 instead of an apertured regulating means. In the latter case, a beam pattern from the first aperture is controlled by the inside 71a of one arm and the inside 71b of the other arm of the L-shaped plate 71. The first and second regulating means may have an equal, or different, aperture configuration or dimension. A beam radiating means constituted of the paired deflection electrodes 49 and 52, may be of an electromagnetic deflection type or an electrostatic deflection type. The same thing can be said with the other deflection electrodes 41 and 44. These deflection electrodes may be placed on the beam source side of the first restricting means. Instead of the deflection electrodes 41 and 44, the first and/or second restricting means 38 and 40 may be moved so that the pattern of an incident beam can be controlled. In this case, for example, the restricting mean is connected to the piezoelectric element so as to assure an accurate movement. Although in the above-mentioned embodiment a square pattern of beams is obtained when voltages applied to the paired deflection electrodes 41, and 44 are all at the 0(V) level, all the beam may be cut off when the voltage applied to the paired deflection electrodes 41 and 44 are all at the 0(V) level. Any required portion of the object may be selectively ion-implanted by replacing electron beams with iron beams.

What is claimed is:

1. An electronic beam exposing apparatus comprising:
   a beam source for emitting electron beams;
   first beam shaping means for shaping said electron beams into a first pattern, said first beam shaping means comprising a first beam restricting aperture and first means for passing said electron beams through said first aperture such that said first pattern is defined by the beams passing through said first aperture;
   second beam-shaping means for shaping said first pattern of electron beams into a second pattern, said second beam-shaping means comprising a second beam restricting aperture and second means for projecting an image of said first pattern against said second aperture, such that said second pattern is defined by the beams passing through said first and second apertures;
   drive means for moving a beam incident position relative to the second aperture of the second beam-shaping means to permit the second beam pattern to be regulated by the second aperture; and;
   means for illuminating focusing the second beam pattern from the second aperture onto an object to be exposed;
   wherein said first and second beam-shaping means, each, are an L-shaped plate.

2. An electronic beam exposing apparatus according to claim 1 in which said drive means is deflection means for permitting a beam deflection.

3. An electronic beam exposing apparatus according to claim 2, in which said deflection means includes a first deflection device disposed between the first and second beam-shaping means to deflect the beam in a first direction, and a second deflection device disposed to permit the beam to be deflected in a second direction normal to said first direction.

* * * * *